United States Patent
Gabillard et al.

(10) Patent No.: US 6,861,908 B2
(45) Date of Patent: Mar. 1, 2005

(54) 2-STAGE LARGE BANDWIDTH AMPLIFIER USING DIODES IN THE PARALLEL FEEDBACK STRUCTURE

(75) Inventors: Bertrand Gabillard, Paris (FR); Michel Rivier, Barbizon (FR); Fabrice Voisin, La Courneuve (FR); Philippe Girard, Corbeil Essonnes (FR)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 10/604,478

(22) Filed: Jul. 24, 2003

(65) Prior Publication Data

US 2004/0263258 A1 Dec. 30, 2004

(30) Foreign Application Priority Data

Jul. 26, 2002 (EP) ............................................ 02368082

(51) Int. Cl.$^7$ ................................................ H03F 3/68
(52) U.S. Cl. ........................................ 330/310; 330/98
(58) Field of Search .......................... 330/98, 133, 150, 330/310, 311

(56) References Cited

U.S. PATENT DOCUMENTS

| | | | |
|---|---|---|---|
| 4,956,615 A | | 9/1990 | Bohme et al. .............. 330/288 |
| 5,574,403 A | * | 11/1996 | Kolluri ........................ 330/310 |
| 6,118,991 A | * | 9/2000 | Jean et al. ................... 330/310 |

FOREIGN PATENT DOCUMENTS

EP 0558 244 A1 2/1993

OTHER PUBLICATIONS

"Tunable Linearity Characteristics of a DC–3 GHz InP HBT Active Feedback Amplifier", Kobayashi, et al., IEEE Oct. 1999, pp. 291–294.
High–Bit–rate, High–Input–Sensitivity Decision Circuit Using Si Bipolar Technology by K.Ishii et al, IEEE Journal of Solid–State Circuits, vol. 29, No. 5, May 1994, pp. 546–549.

* cited by examiner

*Primary Examiner*—Khanh V. Nguyen
(74) *Attorney, Agent, or Firm*—Lisa J. Ulrich

(57) ABSTRACT

There is disclosed an improved 2-stage large bandwidth amplifier (20) comprised of two stages formed by first and second bipolar transistors (Q1,Q2) configured in common emitter that are connected in series with their emitters connected to a first supply voltage (Gnd). The input signal ($V_{in}$) is applied to the base of said first transistor via an input terminal (11), while the output signal ($V_{out}$) is available at an output terminal (12) connected to the collector of said second transistor. A parallel feedback structure (13') is provided. It consists, in a first branch, of two diodes (D1,D2) in series connected between a second supply voltage (Vcc) and the collector of the second bipolar transistor, and in another branch of a third bipolar transistor (Q3) configured in emitter follower with a resistor (Rf) in the emitter. The base and the collector of said third bipolar transistor are respectively connected to the common node of said diodes and to said second supply voltage. The resistor is connected to the common node of said first and second transistors to inject the feedback signal ($V_f$). Because, the two bodies have a low internal resistance and reduce the collector capacitance of the second transistor, the overall bandwidth of the improved amplifier is significantly extended in the very high frequencies (e.g. 20 GHz and above).

2 Claims, 2 Drawing Sheets

2-STAGE LARGE BANDWIDTH AMPLIFIER USING DIODES IN THE PARALLEL FEEDBACK STRUCTURE

BACKGROUND OF INVENTION

The present invention relates to high speed transmission systems and more particularly to an improved 2-stage large bandwidth amplifier with diodes in the parallel feedback structure.

In high speed transmission systems such as those involved in the forthcoming 10 Gb/s Ethernet, the signal after transmission along a media is largely attenuated and needs to be amplified before any operation is performed in the receiving section (A/D conversion, clock synchronization, data serialization, . . . etc.). The amplification circuits of these systems must work at the highest possible speed because bits are serialized in the emitting section before they are sent on a single transmission channel. As a result, bandwidth and gain constraints are imposed to the amplification circuits on the receiving side of these high speed transmission systems.

Conventional amplification solutions are based on bipolar devices that are superior to MOSFET devices because of their higher Ft (transition frequency). The traditional tradeoff between gain and bandwidth usually requires multiple cascaded stages of amplifying bipolar transistors mounted in common emitter and connected in series with a resistive load on the collector of the output transistor. A known refinement is to place a parallel feedback structure from one stage to the preceding one, as shown in FIG. 1.

Now turning to FIG. 1, there is shown such a conventional amplifier referenced 10 that is comprised of two stages simply formed by two bipolar transistors Q1 and Q2 for the sake of simplicity that are connected in series. The collector of transistor Q1 is connected to the base of transistor Q2. The input signal $V_{in}$ is applied to the base of in put transistor Q1 via input terminal 11, while the output signal $V_{out}$ is available at output terminal 12 connected to the collector of the output transistor Q2. The parallel feedback structure 13 consists of a voltage divider comprised of resistors R1 and R2 and a bipolar transistor Q3, referred to as the feedback transistor, configured in emitter follower, that is connected in series with a load resistor Rf. Feedback transistor Q3 injects the feedback signal $V_f$ through said resistor Rf at node 14 to the connecting node of transistors Q1 and Q2, that is referenced 15. The voltage at this node 15 is referenced $V_c$. In normal operation, when the feedback structure is implemented, nodes 14 and 15 are merged and voltages $V_f$ and $V_c$ are identical, this distinction is only worth when the feedback structure 13 is made inoperative, e.g. by cutting the wire between nodes 14 and 15 (as it will be explained later on in due course). Amplifier 10 is biased between a positive voltage Vcc and the ground Gnd. A similar circuit is described in the article "High-Bit-rate, High-In-put-Sensitivity Decision Circuit Using Si Bipolar Technology" by K. Ishii et al, IEEE Journal of Solid-State Circuits, vol 29, No 5, May 1994.

This parallel feedback structure is useful because it reduces the collector-base capacitance of input transistor Q1, which is the cause of the bandwidth roll-off at high frequencies. Nevertheless, the overall bandwidth of amplifier 10 is still limited by the second stage, i.e. Output transistor Q2, because the collector capacitance of transistor Q2 remains large. Moreover, the gain of transistor Q2 is strongly related to the value of resistors R1 and R2 and to its transconductance which vary independently of one another. Finally, amplifier 10 is often unstable, because the gain of feedback structure 13 is quite often greater than 1.

SUMMARY OF INVENTION

It is therefore a primary object of the present invention to provide an improved 2-stage large bandwidth amplifier with diodes in the parallel feedback structure that significantly extends the output transistor Q2 bandwidth, and thus the overall amplifier bandwidth.

It is another object of the present invention to provide an improved 2-stage large bandwidth amplifier with diodes in the parallel feedback structure wherein the gain of the output transistor Q2 is better controlled, and thus the overall amplifier gain.

It is another object of the present invention to provide an improved 2-stage large bandwidth amplifier with diodes in the parallel feedback structure wherein the gain of the feedback loop is adjusted to be lower than 1 for greater stability.

According to the present invention there is described an improved 2-stage large bandwidth amplifier with diodes in the parallel feedback structure comprising:

two amplification stages formed by first and second bipolar transistors configured in common emitter that are connected in series so that the collector of the first transistor and the base of the second transistor form a connecting node and with their emitters tied to a first supply voltage;

an input terminal receiving the input signal connected to the base of said first transistor;

an output terminal connected to the collector of said second transistor where the output signal is available;

a parallel feedback structure consisting in one branch of two diodes connected in series between the collector of said second bipolar transistor and a second supply voltage and in another branch, of a third bipolar transistor, configured in emitter follower with a load resistor in series with the emitter, the collector of which is connected to the second supply voltage and the base is connected to the common node of said diodes, said third bipolar transistor injects the feedback signal at said connecting node of said first and second bipolar transistors.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DETAILED DESCRIPTION

Figure 1:
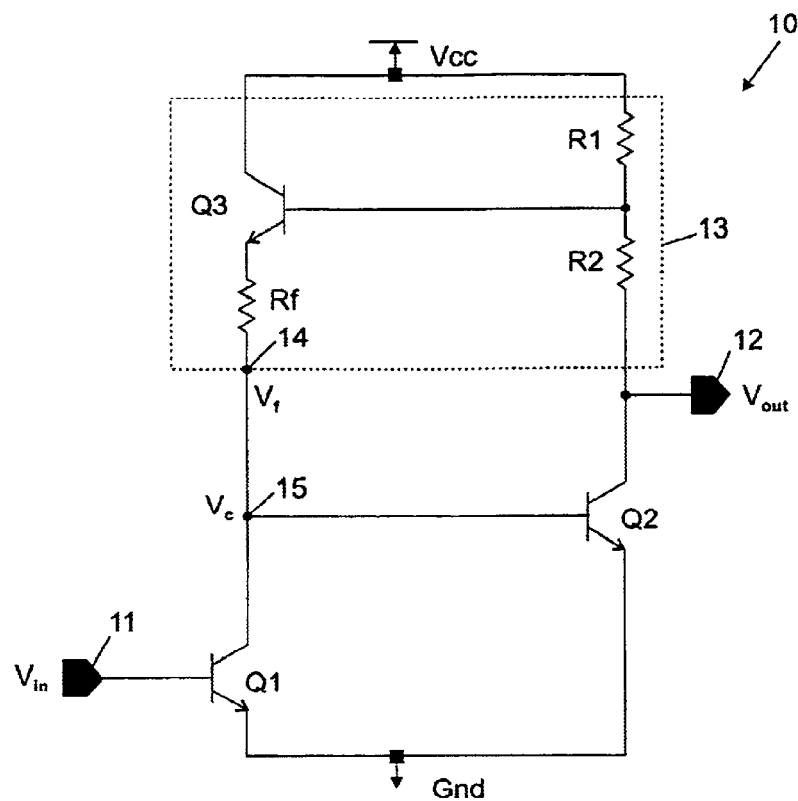
FIG. 1 shows a conventional large bandwidth two-stage amplifier with a parallel feedback structure including a voltage divider made of two resistors.
Figure 2:
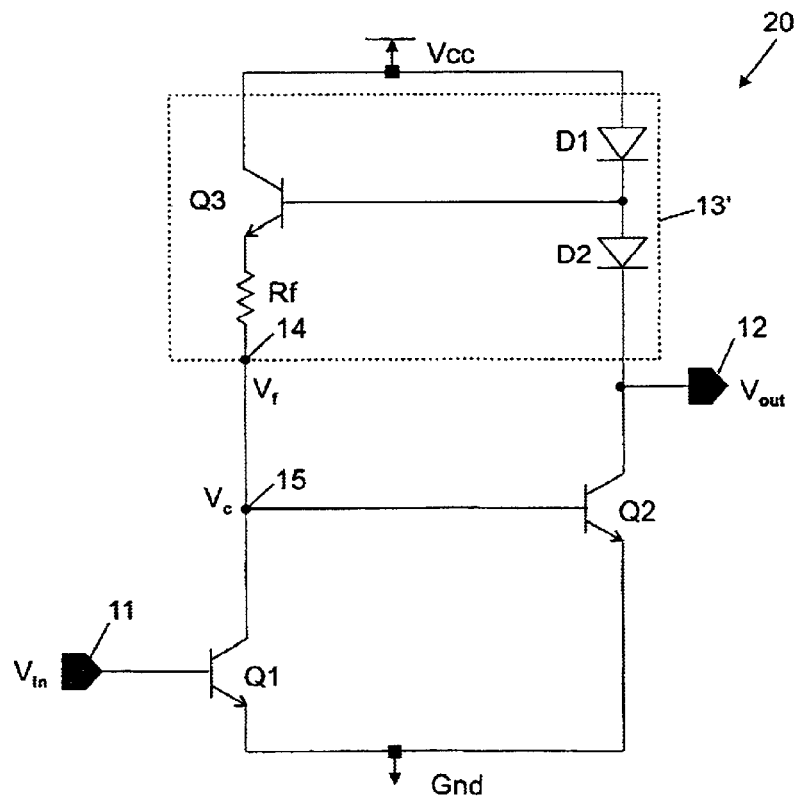
FIG. 2 shows the amplifier of FIG. 1 improved according to the present invention to implement two diodes in the parallel feedback structure.

According to the teachings of the present invention, the amplifier shown in FIG. 1 is improved by reducing the collector capacitance of the output transistor Q2 and getting substantially identical bandwidth for each stage. Now turning to FIG. 2, where the improved amplifier circuit is referenced 20, these objectives are met by replacing the two resistors R1 and R2 by two diode-connected bipolar devices labeled D1 and D2, which can be identical devices. Surprisingly, these diodes D1 and D2 which are not linear elements, perform better than resistors that are perfectly linear. The lower resistance that is presented by the two diodes D1 and D2 also reveals to be a valuable contribution to the expected results. This construction minimizes the capacitance loading on the collector of transistor Q2 and improves the bandwidth of the second stage. The common node between the two diodes is used as the intermediate tap of the resistor divider to still bias transistor Q3 base. But, the feedback ratio is now set by the transconductance ratio (gm) of the diodes. The usual value of gm for standard diodes is in the 25 Ohm$^{-1}$ range for a 1 mA bias. The "dynamic resistance", equal to 1/gm, is thus lower than the resistance value that is used to correctly bias the feedback transistor Q3 in conventional amplifier 10, which is rather in the 50 to 200 Ohms range.

Figure 3:
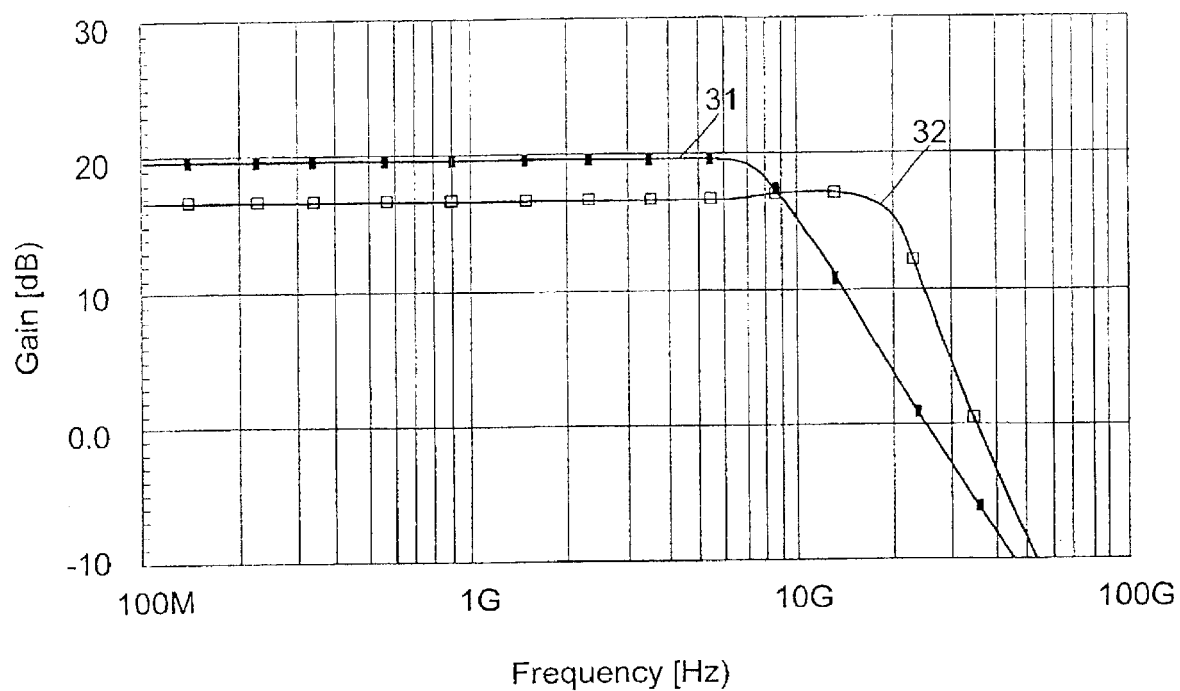
FIG. 3 shows the gain versus the frequency response curves of both the conventional and improved amplifiers.

Let us assume that amplification transistors Q1 and Q2 and feedback devices Q3 and Rf are identical, and the dimensions of devices R1/R2 and D1/D2 are tuned to obtain the maximum bandwidth in either case. Curves 31 and 32 shown in FIG. 3, illustrate the frequency response of amplifiers 10 and 20 respectively. The improved amplifier 20 thus significantly extends the bandwidth of the conventional amplifier 10 above the 20 GHz range, i.e. by a factor of at least two, in the same operating conditions. In addition, as apparent in FIG. 3, at 20 GHz, the improvement in terms of gain is greater than 10 dB. Assuming R1=R2=R and D1=D2=D, Table 1 below gives simulation results for the two amplifiers, allowing a comparison between their respective performance.

TABLE 1

|  | Unit | Conventional | Improved |
| --- | --- | --- | --- |
| Gain 1$^{st}$ stage | dB | 6.84 | 10.95 |
| Gain 2$^{nd}$ stage | dB | 13.17 | 5.57 |
| Total Gain | dB | 19.65 | 16.52 |
| Bandwidth 1$^{st}$ stage | GHz | 36.27 | 25.61 |
| Bandwidth 2$^{nd}$ stage | GHz | 2.69 | 23.89 |
| Total Bandwidth | GHz | 10.22 | 21.96 |

As apparent in Table 1, the improved amplifier 20 has a significantly higher bandwidth (at the cost of a small reduction of the gain) demonstrating thereby the merits of the proposed solution. Note that, with other dimension adjustments, a higher gain with similar bandwidth could be obtained as well. The second stage which benefits from the diode loading on the collector of output transistor Q2 has a bandwidth about 10 times larger than with a resistive load. Applicants' inventors have also noticed another advantages of the improved amplifier 20, not identifiable from Table 1 and in FIG. 3. The gain peaking in the first stage is twice larger with the conventional amplifier than with the improved amplifier (8 dB at 8 GHz vs 1 dB at 16 GHz).

Moreover, the gain of the second stage is defined by the gmQ2×(R1+R2) product in the conventional solution, where gmQ2 is the transconductance of transistor Q2. In the proposed circuit, the gain becomes gmQ2×(gmD1$^{-1}$+gmD2$^{-1}$), where gmD1 and gmD2 are the transconductance of diodes D1 and D2, that is approximately equal to 2. Typically, diodes D1 and D2, are identical devices and are made of a bipolar transistor having the same dimensions that transistor Q2, the base-collector junction of which being short-circuited, to match transistor Q2. As a result, there is less variations across a full process range than with the conventional design of amplifier 10 because of the natural matching of identical components. Table 2 below shows a comparison between the conventional and improved amplifiers in terms of statistical performance.

TABLE 2

|  | Conventional | | | Improved | | |
| --- | --- | --- | --- | --- | --- | --- |
|  | Mean | Sigma | Min–Max | Mean | sigma | Min–Max |
| Gain [dB] | 19.5 | 0.81 | 16.0–20.6 | 16.5 | 0.48 | 13.7–17.2 |
| Bandwidth [GHz] | 9.95 | 1.78 | 4.2–13.0 | 21.9 | 1.12 | 18.6–25.3 |

The process and mismatch variations give lower standard deviations of the gain and of the bandwidth because of the good component matching mentioned above that control the variation of the gain of the second stage of improved amplifier 20. As apparent from Table 2, the standard deviations (sigma) in terms of gain and bandwidth are reduced by approximately 40%. This considerably helps to improve the manufacturing yield.

The stability of both circuits 10 and 20 can be analyzed by comparing the feedback signal $V_f$ to signal $V_c$ on the collector of Q1 and compute the value of the feedback loop gain $V_f/V_c$. To that end, the feedback loop between nodes 14 and 15 is broken. This can be expressed as: $V_f/V_c=(V_f/V_m)\times(V_m/V_{out})\times(V_{out}/V_c)$, where $V_m$ is the voltage at the common node (tap) of the two resistors (FIG. 1) or the two diodes (FIG. 2) and $V_{out}$ the output signal at collector of transistor Q2. The $V_f/V_m$ ratio is approximately equal to 0.9 for an typical emitter follower stage. The $V_m/V_{out}$ ratio equals R1/(R1+R2) for circuit 10 and is equal to gmD1$^{-1}$/(gmD1$^{-1}$+gmD2$^{-1}$) for circuit 20, while the $V_{out}/V_c$ ratio is equal to gmQ2×(R1+R2) and gmQ2×(gmD1$^{-1}$+gmD2$^{-1}$) respectively.

After simplification, the $V_f/V_{out}$ ratio gives a value of 0.9×gmQ2×R1 for the conventional circuit 10 and 0.9 for the improved circuit 20 of the present invention. The first expression can lead to values superior to 1 and thus can cause instability during the design phase but also during manufacturing where variations of process can increase the value of gmQ2 or R1. The improved circuit 20 is never unstable since loop gain is always smaller than 1.

While the invention has been particularly described with respect to a preferred embodiment thereof it should be understood by one skilled in the art that the foregoing and other changes in form and details may be made therein without departing from the spirit and scope of the invention.

What is claimed is:

1. An improved 2-stage large bandwidth amplifier comprising:

A first and second stage amplification circuit, each of the first and second amplification stages comprising at least one bipolar transistor, each bipolar transistor comprising a collector, emitter and base, wherein the first transistor of the first stage and first transistor of the second stage have emitters connected in series, the collector of the first transistor of said first stage and the base of the first transistor of the second stage forming a connecting node, the emitter of said first transistor of said first stage and said emitter of said first transistor of said second stage tied to a first supply voltage (Gnd);

an input terminal receiving the input signal ($V_{in}$) connected to the base of said first transistor of said first stage;

an output terminal connected to the collector of said first transistor of said second stage, the outpt terminal capable of supplying an output signal ($V_{out}$);

a parallel feedback structure having at least two branches, the first branch having at least two diodes, said two diodes connected in series, wherein one of the diodes is connected to the collector of said first transistor of said second stage and the other of the at least two diodes connected to a second supply voltage (Vcc), the second branch having a third bipolar transistor, the third transistor having a collector, emitter and base, said third transistor having a load resistor (Rf) in series with the emitter of the third transistor, the collector of the third transistor connected to the second supply voltage and the base of the third transistor connected to the common node of said at least two diodes, said third bipolar transistor supplying the feedback signal (Vf) at said connecting node of said first transistor of said first stage and first transistor of said second stage.

2. The improved 2-stage large bandwidth amplifier of claim 1 wherein each diode is constructed with a bipolar transistor substantially identical to said first transistor of said second stage, the collector-base junction of said diodes shorted for matching therewith.

* * * * *